United States Patent
Kao

(10) Patent No.: US 8,921,901 B1
(45) Date of Patent: Dec. 30, 2014

(54) STACKED CMOS IMAGE SENSOR AND SIGNAL PROCESSOR WAFER STRUCTURE

(71) Applicant: United Microelectronics Corp., Hsin-Chu (TW)

(72) Inventor: Ching-Hung Kao, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/914,612

(22) Filed: Jun. 10, 2013

(51) Int. Cl.
| | |
|---|---|
| H01L 27/148 | (2006.01) |
| H01L 29/768 | (2006.01) |
| H01L 27/01 | (2006.01) |
| H01L 27/12 | (2006.01) |
| H01L 31/0392 | (2006.01) |
| H01L 31/00 | (2006.01) |
| H01L 27/146 | (2006.01) |

(52) U.S. Cl.
CPC .... *H01L 27/14812* (2013.01); *H01L 27/14687* (2013.01)
USPC ........... 257/226; 257/350; 257/351; 257/444; 257/E27.137; 257/E27.144; 257/E27.161

(58) Field of Classification Search
USPC ................. 257/226, 350, 351, 444, E27.137, 257/E27.144, E27.161
See application file for complete search history.

(56) References Cited

U.S. PATENT DOCUMENTS

| | | | |
|---|---|---|---|
| 7,642,555 B2 * | 1/2010 | Ishikawa | 257/60 |
| 8,212,328 B2 * | 7/2012 | Pyo | 257/447 |
| 8,274,101 B2 * | 9/2012 | Venezia et al. | 257/228 |
| 8,536,670 B2 * | 9/2013 | Yoshihara et al. | 257/431 |
| 8,642,939 B2 * | 2/2014 | Yoshihara et al. | 250/208.1 |
| 8,748,210 B2 * | 6/2014 | Aoki | 438/57 |
| 8,766,389 B2 * | 7/2014 | Sato | 257/443 |
| 2012/0061789 A1 | 3/2012 | Yang | |
| 2013/0020662 A1 | 1/2013 | Kao | |
| 2013/0277789 A1 * | 10/2013 | Chen et al. | 257/460 |
| 2013/0321680 A1 * | 12/2013 | Kumano | 348/273 |
| 2014/0011316 A1 * | 1/2014 | Park et al. | 438/70 |
| 2014/0042299 A1 * | 2/2014 | Wan et al. | 250/208.1 |
| 2014/0070353 A1 * | 3/2014 | Kim | 257/459 |

* cited by examiner

*Primary Examiner* — Ida M Soward
(74) *Attorney, Agent, or Firm* — Winston Hsu; Scott Margo

(57) ABSTRACT

A stacked wafer structure includes a CIS wafer, an ISP wafer, a lamination layer, a through silicon via and a pixel device. The CIS wafer bonds to the ISP wafer through the lamination layer. The pixel device is disposed on the CIS wafer. The through silicon via penetrates either the CIS wafer or the ISP wafer to connect devices in CIS wafer to the devices in ISP wafer electrically.

11 Claims, 7 Drawing Sheets

STACKED CMOS IMAGE SENSOR AND SIGNAL PROCESSOR WAFER STRUCTURE

BACKGROUND OF THE INVENTION

1. Field of the Invention

The present invention relates to stacked wafer structure and method of fabricating thereof, and more particularly, to a stacked wafer structure having a trough silicon via penetrate either a CIS wafer or a ISP wafer to electrically connect the device in the CIS wafer to the device in the ISP wafer.

2. Description of the Prior Art

General image sensors are roughly classified into charge coupled device (CCD) image sensors and CMOS image sensors (CISs). Compared with the CCD image sensors, the CISs are widely used in portable apparatuses.

A pixel array of a CIS includes a plurality of pixels, and each of the pixels may generate an image signal from an optical signal. In detail, each of the pixels integrates photo-charges corresponding to the amount of light incident using a photodiode and generates an analog pixel signal corresponding to the integrated photocharges.

In general, the analog pixel signal output from each of the pixels is converted into a digital signal and then the digital signal is image-processed by an image signal processor (ISP).

In a conventional fabricating process, the CIS circuits and ISP circuits are formed on the same substrate, however, results in an increase in the number of processes and high cost. For example, a backside-illuminated (BIS) process is often applied to the entire substrate to thin the substrate and fabricate color filers on the back side of the substrate corresponding to the CIS circuits. During the BIS process, the substrate with the ISP circuits has no alternative but to undergo the BIS process, which will increase the fabricating time. Moreover, the line width of the ISP circuits will be compromised because the CIS circuits and the ISP circuits are fabricated by the same lithographic process, which may cause degradation in the characteristics of the ISP device.

SUMMARY OF THE INVENTION

In this regard, methods and structures for assembling the ISP wafer and the CIS wafer at the chip level while both reducing the size and improving the characteristics are proposed.

According to one embodiment of the present invention, a stacked wafer structure comprising a CIS wafer, an ISP wafer, a lamination layer, a through silicon via and a pixel device. The CIS wafer includes a CIS substrate having a front side and a back side opposing to the front side, a first dielectric layer disposed on the front side of the CIS substrate and at least one set of first conductive stack disposed within the first dielectric layer. The ISP wafer comprising an ISP substrate, a second dielectric layer disposed on the ISP substrate, at least one set of second conductive stack disposed within the second dielectric layer and at least one active device disposed on the ISP substrate. The lamination layer is disposed between the first dielectric layer and the second dielectric layer so as to bond the CIS wafer to the ISP wafer. The through silicon via penetrates the CIS wafer and the lamination layer so as to electrically connects the first conductive stack to the second conductive stack. The pixel device is disposed on the back side of the CIS substrate.

According to another embodiment of the present invention, a stacked wafer structure includes substantially the same elements as those in the forgoing embodiment except the through silicon via penetrating the ISP wafer rather than the CIS wafer.

According to another embodiment of the present invention, a method of stacking wafers comprising providing a CIS wafer and an ISP wafer, wherein the CIS wafer comprises a CIS substrate, a first dielectric layer disposed on the CIS substrate, at least one set of first conductive stack disposed within the first dielectric layer, and the ISP wafer comprises a ISP substrate, a second dielectric layer disposed on the ISP substrate, at least one set of second conductive stack and at least one active device disposed on the ISP substrate. Later, a lamination layer is formed between the first dielectric layer and the second dielectric layer. Thereafter, the first dielectric layer of the CIS wafer bonds to the second dielectric layer of the ISP wafer. Subsequently, the CIS substrate is thinned. Finally, at least one through silicon via is formed to penetrate one of the CIS wafer and ISP wafer, wherein the through silicon via extends into the lamination layer so as to connect the first conductive stack to the second conductive stack electrically.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 3 and 8 to 11 are schematic cross-sectional diagrams of fabricating a stacked wafer structure at various stages according to a second preferred embodiment of the present invention.

DETAILED DESCRIPTION

FIGS. 1 to 7 are schematic cross-sectional diagrams of fabricating a stacked wafer structure at various stages according to a first preferred embodiment of the present invention. It is understood that FIGS. 1 to 7 have been simplified for a better understanding of the inventive concepts of the present disclosure and may not be drawn to scale.

Figure 1:
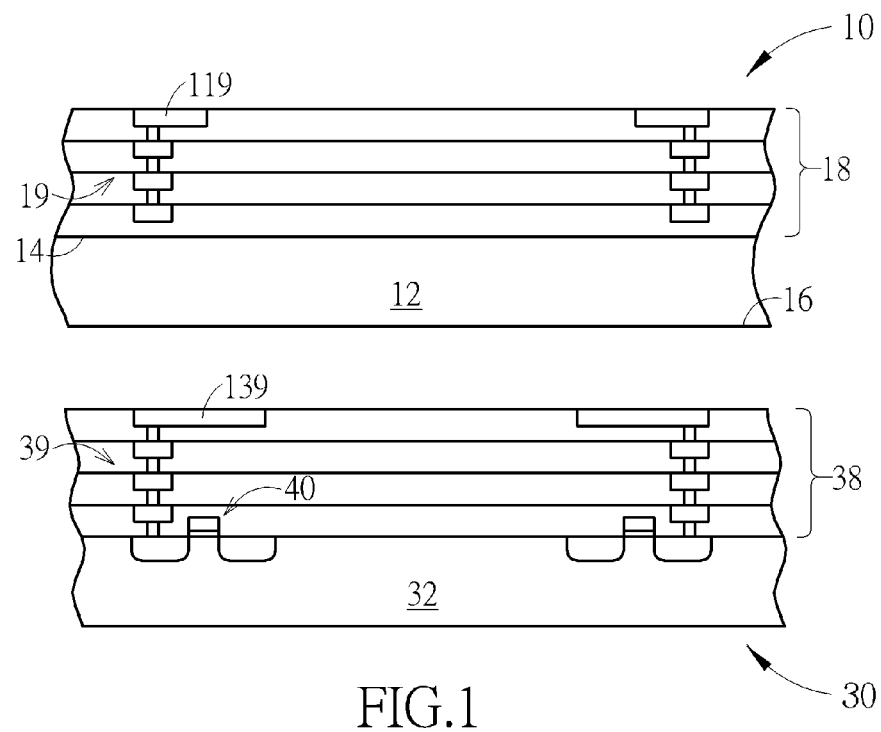
FIGS. 1 to 7 are schematic cross-sectional diagrams of fabricating a stacked wafer structure at various stages according to a first preferred embodiment of the present invention.

With reference to FIG. 1, a CMOS image sensors (CIS) wafer 10 and an image signal processor (ISP) wafer 30 are provided. The CIS wafer 10 includes a CIS substrate 12 having a front side 14 and a back side 16, an interlayer dielectric layer 18 disposed on the front side 14 of CIS substrate 12, at least one set of conductive stack 19 disposed within the interlayer dielectric layer 18. The conductive stack 19 may include numerous metal vias and pads. The upmost layer of the conductive stack 19 defined as a last metal 119 which is exposed through the interlayer dielectric layer 18 and often serves as a bonding pad. The front side 14 of the CIS substrate 12 is opposing to the back side 16 of the CIS substrate 12, and facing away from the interlayer dielectric layer 18. Furthermore, at least one transistor (not shown) may be formed on the CIS substrate 12 and connects to the conductive stack 19 electrically. The transistor can be a reset transistor, a source follower, a row selector or other types of transistors. A pixel region (not shown) for receiving an incident light formed within the CIS substrate 12.

The ISP wafer 30 comprises an ISP substrate 32, an interlayer dielectric layer 38 disposed on the ISP substrate 32, at least one set of conductive stack 39 and at least one active device 40 such as a transistor are disposed on the ISP substrate 32. The conductive stack 39 may include numerous metal vias and pads. The upmost layer of the conductive stack 39 defined as a last metal 139 which is exposed through the interlayer dielectric layer 38 and often serves as a bonding pad. The active device 40 may be a transistor embedded within the interlayer dielectric layer 38 or embedded within the ISP substrate 32. FIG. 1 takes the active device 40 embedded within the interlayer dielectric layer 38 as an example. The CIS substrate 12 and the ISP substrate 32 may independently be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The conductive stacks 19/39 are preferably formed by metal such as copper, aluminum, aluminuim copper or other conductive materials. Moreover, the interlayer dielectric layers 18/38 may be silicon oxide, silicon nitride, silicon oxynitride or other insulating materials. The top surface of the interlayer dielectric layers 18/38 can be planarized by chemical mechanical polishing.

Figure 2:
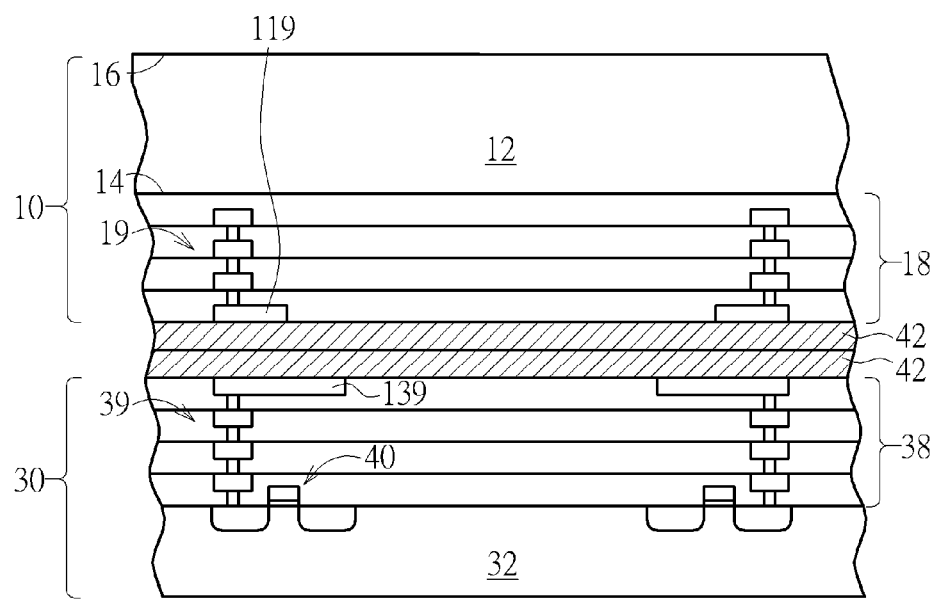

As show in FIG. 2, a bonding step is performed by forming a lamination layer 42 such as silicon oxide or silicon nitride on top surface of the interlayer dielectric layer 18 or on the on top surface of interlayer dielectric layer 38. Alternatively, the lamination layer 42 can be formed on both top surfaces of the interlayer dielectric layer 18 and the interlayer dielectric layer 38. Then, the CIS substrate 12 and the ISP substrate 32 are disposed facing to opposite directions, and the lamination layer 42 is sandwiched between the interlayer dielectric layer 18 and the interlayer dielectric layer 38. Thereafter, the CIS wafer 10 and the ISP wafer are bonded together by annealing the lamination layer 42. Specifically, the interlayer dielectric layer 18 of the CIS wafer 10 is bonded to the interlayer dielectric layer 38 of ISP wafer 30 through the lamination layer 42.

Figure 3:
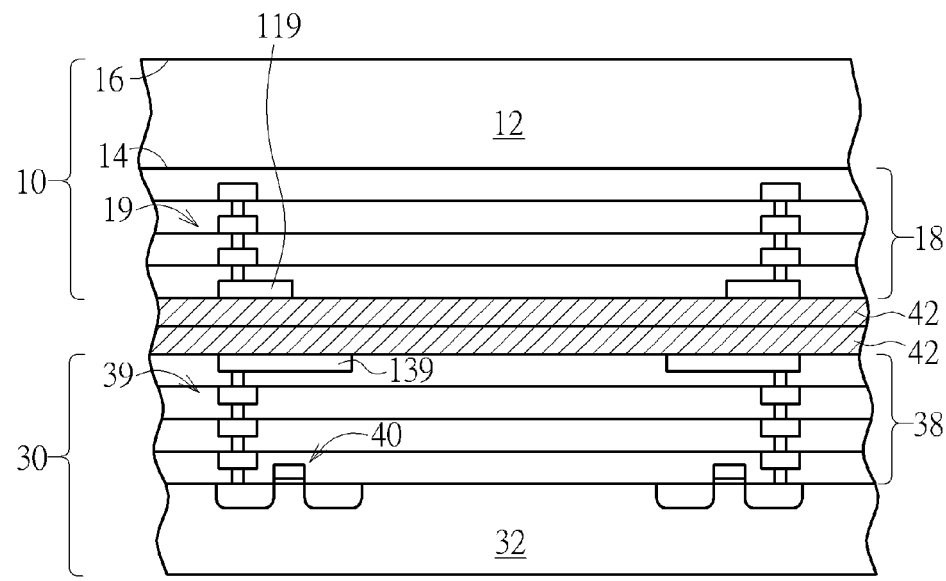

The following FIG. 1 to FIG. 7 will illustrate schematic cross-sectional diagrams of fabricating a stacked wafer by utilizing an ISP wafer as a carrier according to a first preferred embodiment. As shown in FIG. 3, after bonding the CIS wafer 10 and the ISP wafer 30 together, the ISP wafer 30 is disposed below the CIS wafer 10 to serve as a carrier wafer, and the back side 16 of the CIS substrate 12 is thinned. It is note worthy that when thinning the CIS substrate 12, the ISP wafer 30 supports the CIS wafer 10 and prevents the CIS wafer 10 from breaking.

Figure 4:
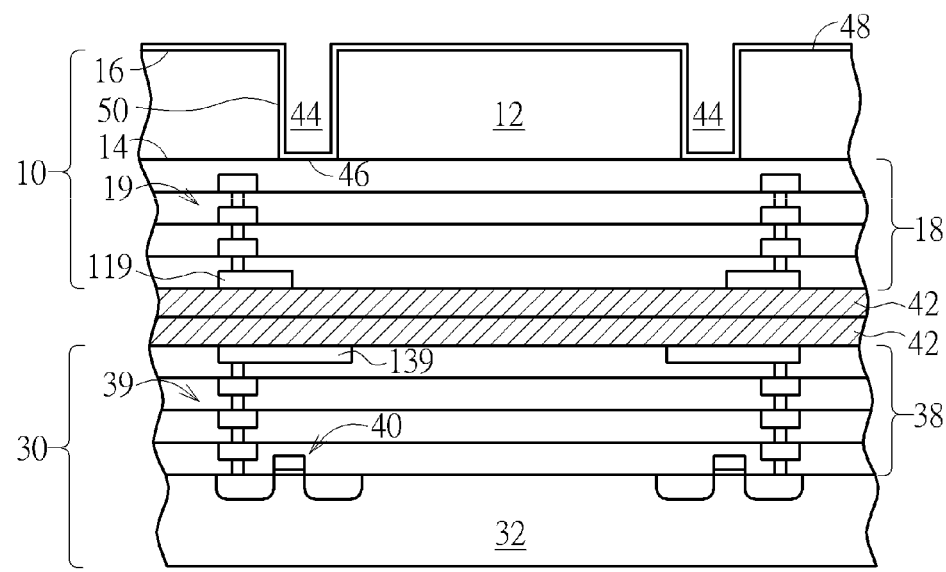
Figure 5:
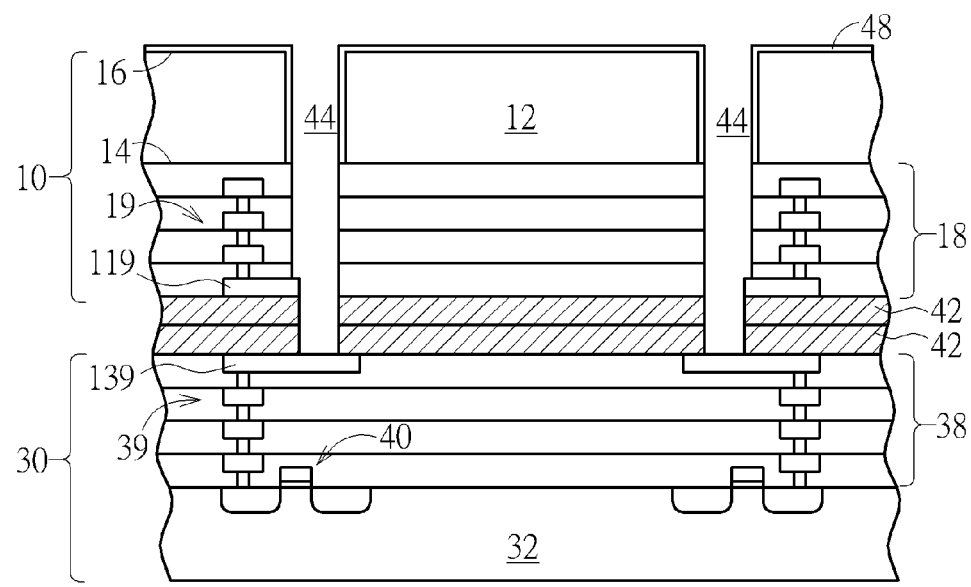

FIGS. 4 to 5 show a first method for performing a backside pad etch to form a through silicon trench 44 in the CIS wafer 10 and the interlayer dielectric layer 38.

As shown in FIG. 4, a backside pad etch is performed by etching the back side 16 of the CIS substrate 12 and forming a through silicon trench 44 penetrating the CIS substrate 12. At this point, the through silicon trench 44 takes the interlayer dielectric layer 18 as a bottom 46. Later, an insulating layer 48 is formed to conformally cover a sidewall 50, the bottom 46 of the through silicon trench 44 and the back side 16 of the CIS substrate 12. The insulating layer 48 may be silicon oxide or silicon nitride. Please refer to FIG. 5, the insulating layer 48 on the bottom 46 of the through silicon trench 44, the lamination layer 42, and the interlayer dielectric layers 18 are etched to extend the through silicon trench 44 into the interlayer dielectric layers 18 and the lamination layer 42, and the etch step is stopped on the last metal 139. At this point, both of last metals 119/139 are partly exposed through the extended through silicon trench 44.

Figure 6:
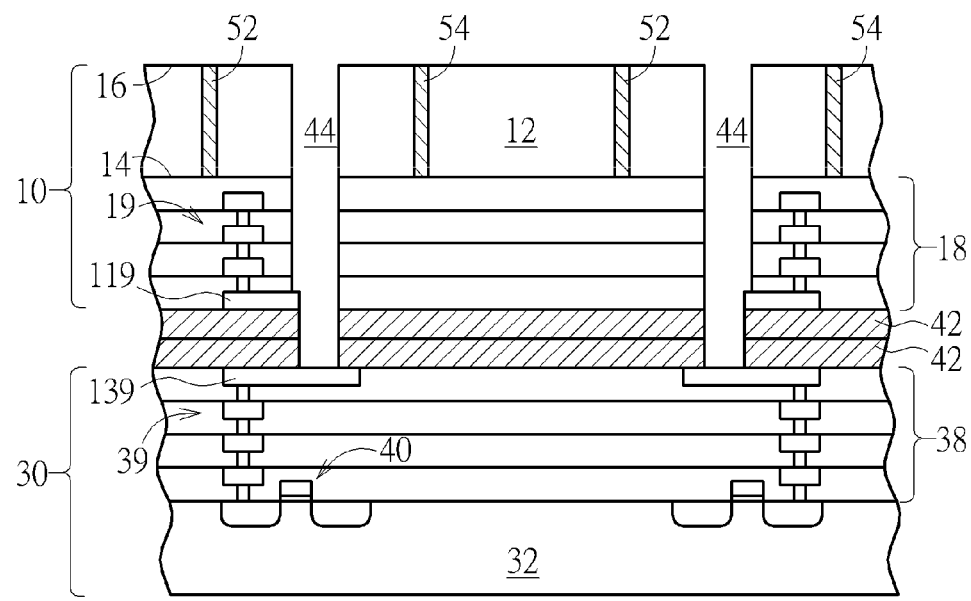

FIG. 6 show a second method for performing the backside pad etch to form a through silicon trench 44 in the CIS wafer 10 and the interlayer dielectric layer 38, wherein like reference numerals are used to refer to like elements throughout. As shown in FIG. 6, at least a pair of deep trench isolations 52/54 are formed in the CIS substrate 12. Later, a through silicon trench 44 is formed between the two deep trench isolations 52/54. Furthermore, the through silicon trench 44 penetrates the CIS wafer 10 and extends into the lamination layer 42. Moreover, the last metals 119/139 are exposed partly through the through silicon trench 44. The method in FIG. 6 can also be applied to the method illustrated in FIG. 4 to FIG. 5 by forming deep trench isolations 52/54 before the through silicon trench 44.

FIGS. 4 to 5 and FIG. 6 illustrate two different methods to form the through silicon trench 44. The two methods can be performed based on different requirements. However, the following figures will take the first method illustrating in FIGS. 4 to 5 as an example.

Figure 7:
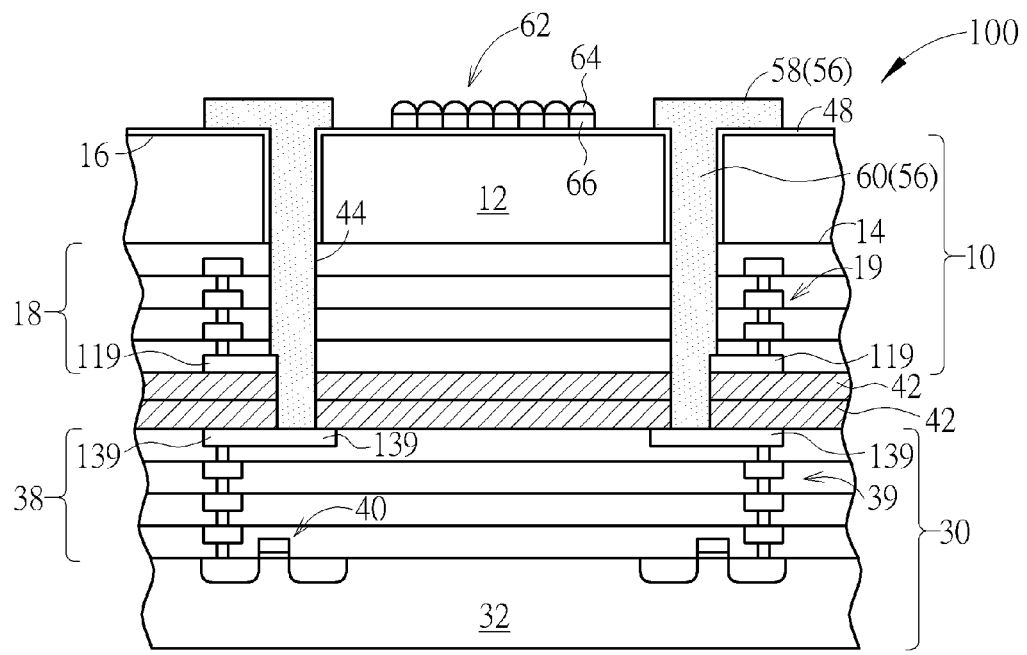

Please refer to FIG. 7, a liner (not shown) and a barrier (not shown) can be formed conformally in the through silicon trench 44. Then, the liner and the barrier at the bottom of the through silicon trench 44 is removed. Later, a conductive layer 56 such as copper, aluminum, aluminuim copper or other conductive materials fills in the through silicon trench 44 and formed on the insulating layer 48. After that, the conductive layer 56 on the insulating layer is patterned to form at least one pad 58, and the conductive layer 56 in the through silicon trench 44 serves as a through silicon via 60. The through silicon via 60 contacts the exposed last metal 119 and the last metal 139, therefore electrically connects the conductive stack 19 to the conductive stack 39.

Please continue to refer to FIG. 7. After the through silicon via 60 is formed, at least one pixel device 62 is fabricated on insulating layer 48 disposed on the back side 16 of the CIS substrate 12. The pixel device 62 may include numerous color filers 66 and microlens 64. At this point, a wafer stack structure 100 fabricated according to the first preferred embodiment of the present invention is completed.

The following FIGS. 1 to 3 and 8 to 11 will show schematic cross-sectional diagrams of fabricating a stacked wafer structure by penetrating the ISP substrate to form a trough silicon via according to a second preferred embodiment of the present invention, wherein like reference numerals are used to refer to like elements throughout. It is understood that FIGS. 8 to 11 have been simplified for a better understanding of the inventive concepts of the present disclosure and may not be drawn to scale.

As shown in FIGS. 1 to 3, a CIS wafer 10 and an ISP wafer 30 are provided. Subsequently, the CIS wafer 10 and the ISP wafer 30 are bonded together through the lamination layer 42. Later, the CIS substrate 12 is thinned. The detail descriptions for the fabricating steps in FIG. 1 to FIG. 3 are disclosed in the previous paragraphs; an accompanying detail description is therefore omitted.

Figure 8:
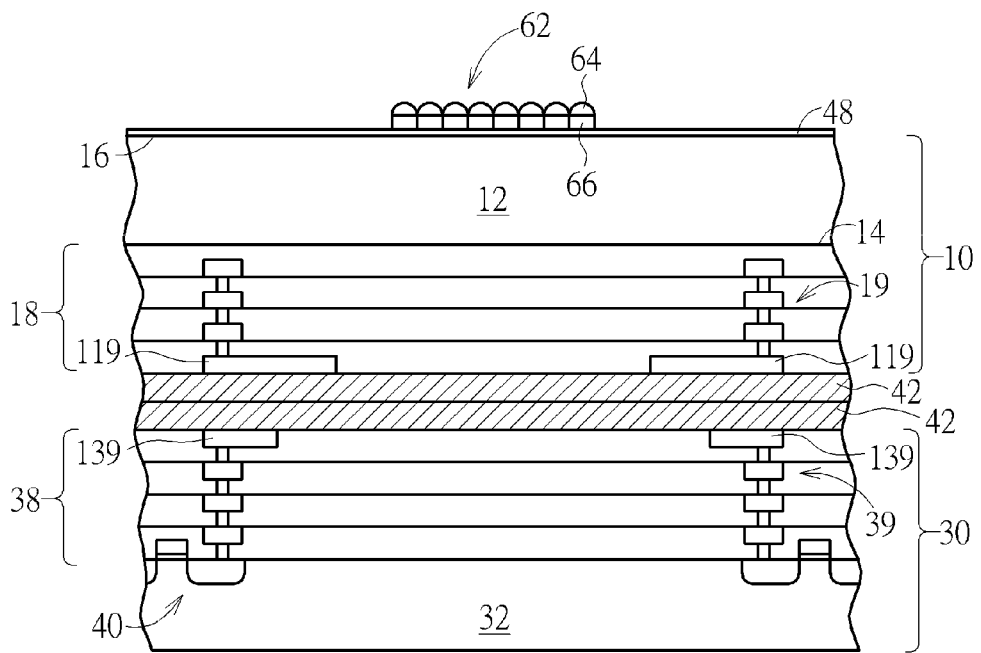
Figure 9:
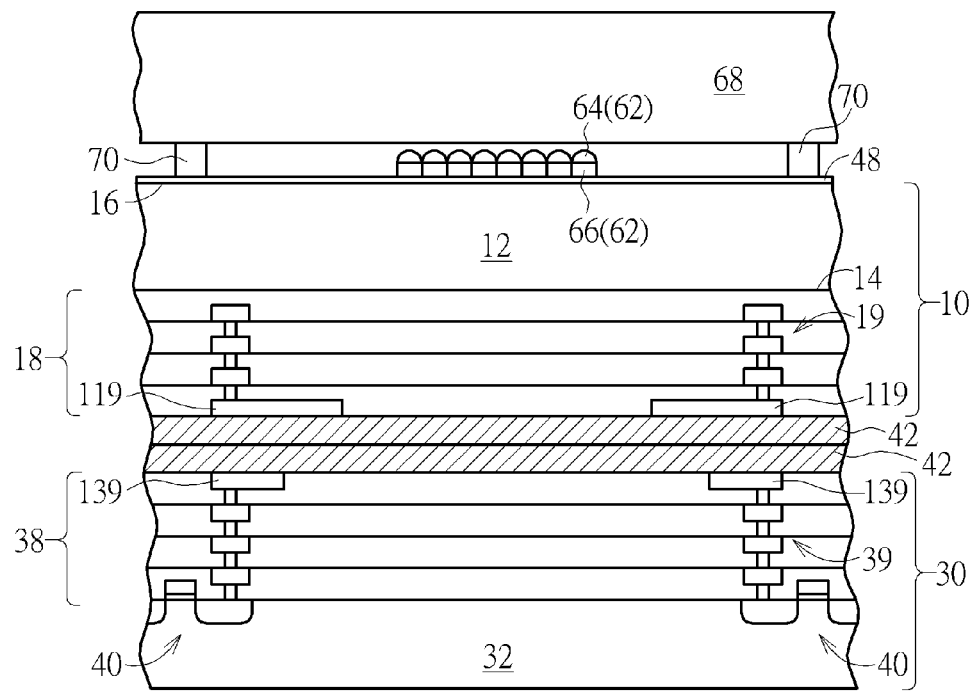

Please refer to FIG. 8, in continuous from FIG. 3, an insulating layer 48 is formed on the back side 16 of the CIS substrate 12. Then, a pixel device 62 is formed on the insulating layer 48. The pixel device 62 may include numerous color filers 66 and microlens 64. As shown in FIG. 9, a transparent layer 68 such as a glass is formed above the back side 16 of the CIS substrate 12 and covers the pixel device 62. The transparent layer 68 may be bond to the back side 16 of the CIS substrate 12 through a connecting post 70.

Figure 10:
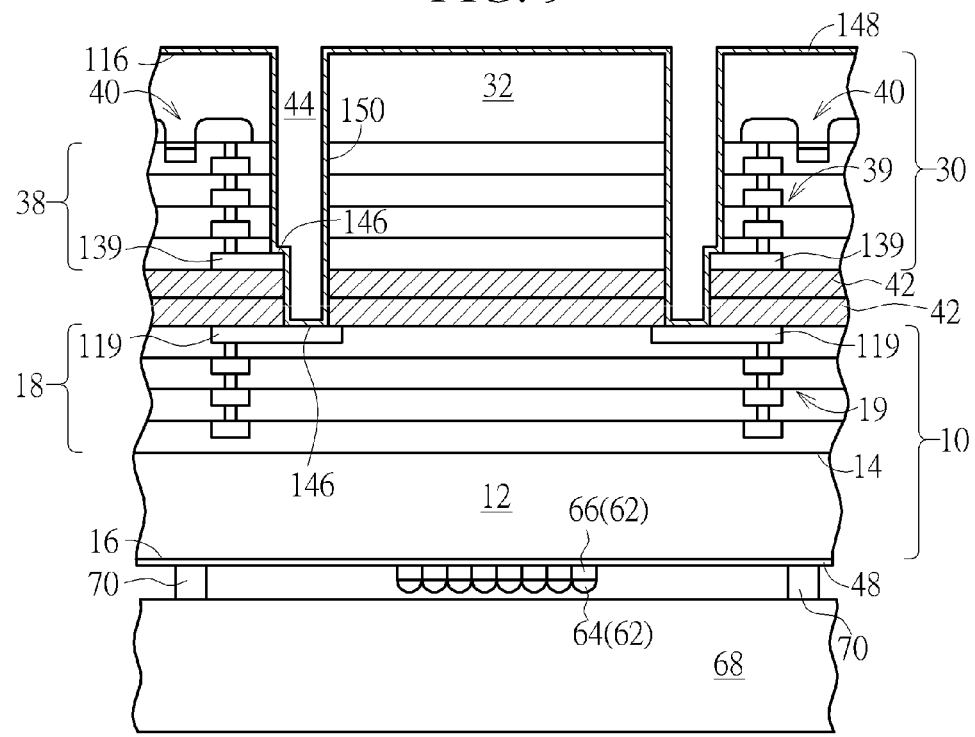

As shown in FIG. 10, at least one through silicon trench 44 is formed to penetrate the ISP wafer 30 and the lamination layer 42 and stop on the last metal 119. The last metal 119 and the last metal 139 are exposed through the through silicon trench 44. Specifically speaking, the through silicon trench 44 is formed by taking the transparent layer 68 as support to etch the ISP substrate 32 and the lamination layer 42. Thereafter, an insulating layer 148 is formed to conformally cover a vertical wall 150 and a horizontal wall 146 of the through silicon trench 44. The insulating layer 148 covers a back side 116 of the ISP substrate 32 as well.

Figure 11:
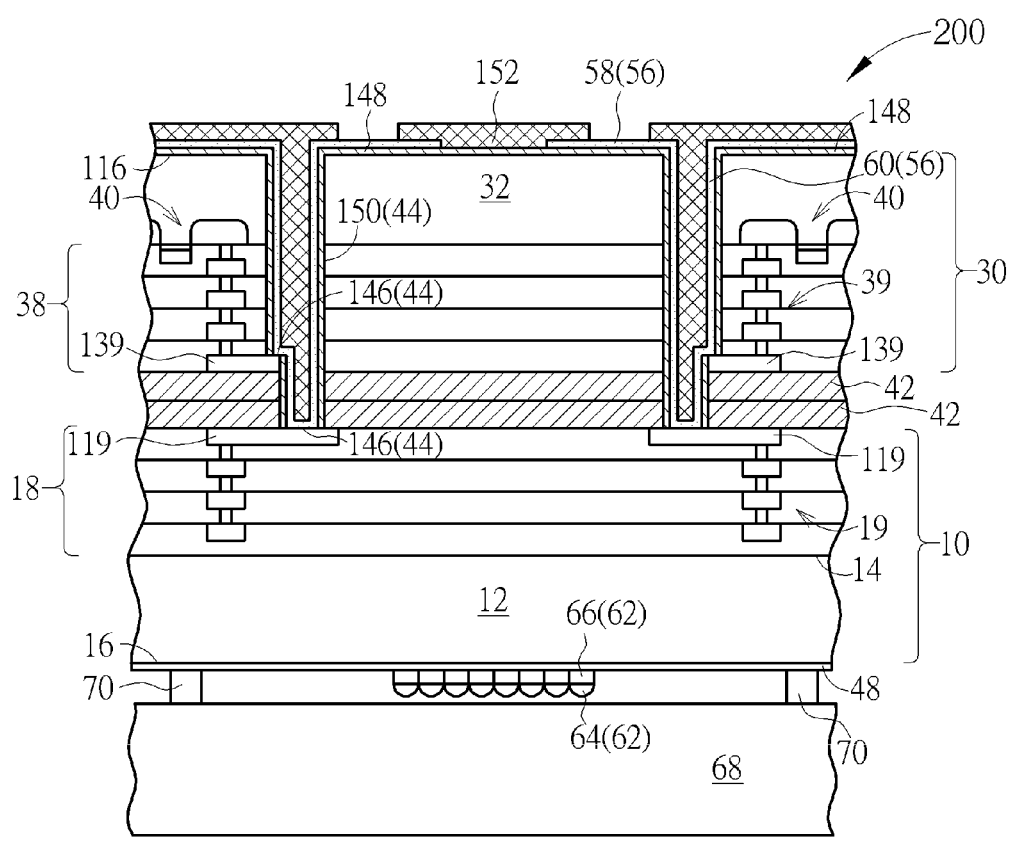

Please refer to FIG. 11, an etch process is performed to remove the insulating layer 148 disposed on the horizontal wall 146 of the through silicon trench 44 so as to expose the last metals 119/139 partly. After that, a conductive layer 56 such as copper, aluminum, aluminuim copper or other conductive materials fills in the through silicon trench 44 and formed conformally on the insulating layer 148, and on the exposed last metals 119/139. Later, the conductive layer 56 on the insulating layer 148 is patterned to form a pad 58 or a redistribution layer (RDL) (not shown). The conductive layer 56 in the through silicon trench 44 serves as a trough silicon via 60. Before the conductive layer 56 is formed, a liner (not show) and a barrier layer (not show) can be formed in the through silicon trench 44. Finally, a passivation layer 152 is formed in the through silicon trench 44 and on the back side 116 of the ISP substrate 32. At this point, a wafer stack structure 200 fabricated according to the second preferred embodiment of the present invention is completed. It is noteworthy that the passivation layer 152 and the insulating layer 148 sandwich the conductive layer 56.

Figure 12:
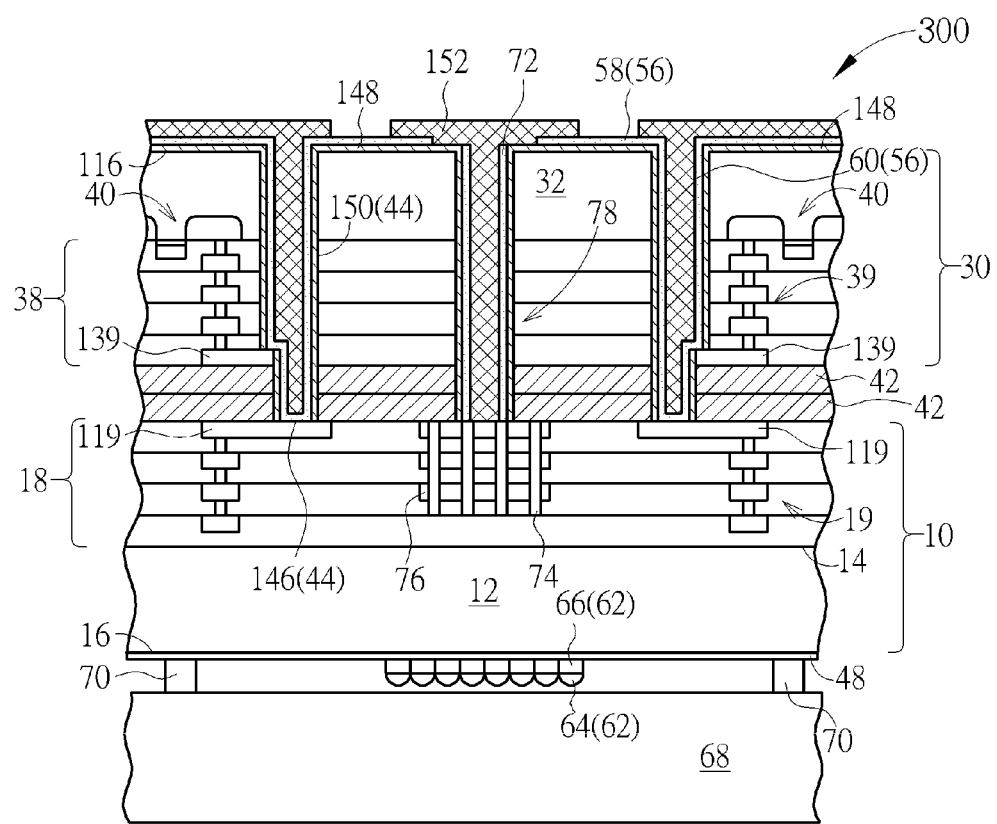
FIG. 12 depicts schematically a stacked wafer structure formed by a method provided in the present invention.

As show in FIG. 12, the fabricating method of the through silicon via shown in FIGS. 10 to 11 can also be applied to form a heat control via 72. The heat control via 72 can connects to numerous pads 76 and vias 74 for cooling down the ISP wafer 30 and CIS wafer 10.

FIG. 7 depicts schematically a stacked wafer structure 100 formed by the method provided in the present invention. As shown in FIG. 7, a stacked wafer structure 100 includes a CIS wafer 10, an ISP wafer 30, a lamination layer 42, a through silicon via 60 and a pixel device 62. The CIS wafer 10 bonds to the ISP wafer 30 through the lamination layer 42. The CIS wafer 10 includes a CIS substrate 12 having a front side 14 and a back side 16 opposing to the front side 14, an interlayer dielectric layer 18 disposed on the front side 16 of the CIS substrate 12 and at least one set of conductive stack 19 disposed within the interlayer dielectric layer 18. The conductive stack 19 preferably includes numerous metal vias and pads. The upmost layer of the conductive stack 19 defined as a last metal 119 which is exposed through the interlayer dielectric layer 18 and often serves as a bonding pad. Furthermore, at least one transistor (not shown) may be formed on front side 14 the CIS substrate 12 and connects to the conductive stack 19 electrically. The transistor can be a reset transistor, a source follower, a row selector or other types of transistors. A pixel region (not shown) for receiving an incident light formed within the CIS substrate 12.

The ISP wafer 30 includes an ISP substrate 32, an interlayer dielectric layer 38 disposed on the ISP substrate 32, at least one set of conductive stack 39 disposed within the interlayer dielectric layer 38 and at least one active device 40 disposed on the ISP substrate 32. The conductive stack 39 preferably include numerous vias and pads. The upmost layer of the conductive stack 39 is a last metal 139 which is exposed through the interlayer dielectric layer 38 and often serves as a bonding pad. The active device 40 can be a transistor embedded within the interlayer dielectric layer 38 or embedded within the ISP substrate 32. The active device 40 may be connecting to conductive stack 39 electrically.

In addition, the lamination layer 42 is disposed between the interlayer dielectric layers 18/38. The lamination layer 42 may be silicon oxide or silicon nitride. The pixel device 62 may include numerous color filers 66 and microlens 64. The stacked wafer structure 100 further includes an insulating layer 48 surrounding the through silicon via 60 within the CIS substrate 12.

In this embodiment, the through silicon via 60 penetrates the CIS wafer 10 and the lamination layer 42, and through silicon via 60 directly contacts the last metals 119/139 so as to electrically connect the conductive stack 19 to the conductive stack 39.

FIG. 11 depicts schematically a stacked wafer structure 200 formed by another method provided in the present invention. The difference between the stacked wafer structures 100/200 respectively in FIG. 7 and FIG. 11 is that the through silicon via 60 in FIG. 11 penetrates the ISP wafer 30 and the lamination layer 42, and the through silicon via 60 stops on the last metal 119. By contacting the last metals 119/139, the through silicon via 60 electrically connect the conductive stack 39 to the conductive stack 19. Alternatively, the through silicon via 100 in FIG. 7 penetrates the CIS wafer 10 rather than ISP wafer 30. Moreover, the stacked wafer structures 200 in FIG. 11 further includes a transparent layer 68 such as a glass is disposed above the back side 16 of the CIS substrate 12 and covers the pixel device 62. Furthermore, the profile of the through silicon via 60 in FIG. 11 is shaped by the through silicon trench 44, and a passivation layer 152 is filled in the through silicon trench 44. The through silicon via 60 surrounds the passivation layer 152 in the through silicon trench 44.

FIG. 12 depicts schematically a stacked wafer structure 300 formed by yet another method provided in the present invention. The difference between the stacked wafer structures 200/300 respectively in FIG. 11 and FIG. 12 is that a heat sink structure 78 is further included in the stacked wafer structure 300. As shown in FIG. 12, a heat control via 72 penetrates the ISP wafer 30 and the lamination layer 42. A plurality of pads 76 and vias 74 are disposed in the interlayer dielectric layer 18. The heat control via 72 connects to numerous pads 76 and vias 74 to form a heat sink structure 78 for cooling down the ISP wafer 30 and CIS wafer 10. Other elements in FIG. 11 and FIG. 12 are substantially the same as those in the embodiment of FIG. 7; an accompanying explanation is therefore omitted.

The present invention bond the CIS wafer to the ISP wafer by a lamination layer to form a stacked wafer. It is note worthy that at least one trough silicon via penetrates either CIS wafer or ISP wafer to electrically connect the devices on the CIS wafer to the device on the ISP wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A stacked wafer structure, comprising:
   a CIS wafer comprising:
      a CIS substrate having a front side and a back side opposing to the front side;
      a first dielectric layer disposed on the front side of the CIS substrate; and
      at least one set of first conductive stack disposed within the first dielectric layer;

an ISP wafer comprising:
an ISP substrate;
a second dielectric layer disposed on the ISP substrate;
at least one set of second conductive stack disposed within the second dielectric layer; and
at least one active device disposed on the ISP substrate;
a lamination layer disposed between the first dielectric layer and the second dielectric layer so as to bond the CIS wafer to the ISP wafer;
a through silicon via penetrating the CIS wafer and the lamination layer so as to electrically connects the first conductive stack to the second conductive stack; and
a pixel device disposed on the back side of the CIS substrate.

2. The stacked wafer structure of claim 1, wherein the active device comprises a transistor.

3. The stacked wafer structure of claim 1, wherein a pixel device comprises a plurality of color filers and a plurality of microlens.

4. The stacked wafer structure of claim 1, further comprising an insulating layer surrounding the through silicon via within the CIS substrate.

5. The stacked wafer structure of claim 1, wherein the lamination layer comprises silicon oxide or silicon nitride.

6. A stacked wafer structure, comprising:
a CIS wafer comprising:
a CIS substrate having a front side and a back side opposing to the front side;
a first dielectric layer disposed on the front side of the CIS substrate; and
at least one set of first conductive stack disposed within the first dielectric layer;
an ISP wafer comprising:
an ISP substrate;
a second dielectric layer disposed on the ISP substrate;
at least one set of second conductive stack disposed within the second dielectric layer; and
at least one active device disposed on the ISP substrate;
a lamination layer disposed between the first dielectric layer and the second dielectric layer so as to bond the CIS wafer to the ISP wafer;
a through silicon via penetrating the ISP wafer and the lamination layer so as to electrically connects the first conductive stack to the second conductive stack; and
a pixel device disposed on the back side of the CIS substrate.

7. The stacked wafer structure of claim 6, wherein the active device comprises a transistor.

8. The stacked wafer structure of claim 6, wherein a pixel device comprises a plurality of color filers and a plurality of microlens.

9. The stacked wafer structure of claim 6, further comprising an insulating layer surrounding the through silicon via within the ISP substrate.

10. The stacked wafer structure of claim 6, further comprising a transparent layer disposed on the pixel device.

11. The stacked wafer structure of claim 6, further comprising a heat sink structure, wherein heat sink structure comprises:
a heat control via penetrating the ISP wafer and the lamination layer; and
a plurality of pads and vias connecting to the heat control via, the pads and vias disposed in the first dielectric layer.

* * * * *